(12) United States Patent
Ehlers et al.

(10) Patent No.: US 7,352,259 B2
(45) Date of Patent: Apr. 1, 2008

(54) BROADBAND STEP ATTENUATOR WITH IMPROVED TIME DOMAIN PERFORMANCE

(75) Inventors: Eric R. Ehlers, Santa Rosa, CA (US); David J. Dascher, Monument, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 200 days.

(21) Appl. No.: 11/151,854

(22) Filed: Jun. 13, 2005

(65) Prior Publication Data

US 2006/0279376 A1    Dec. 14, 2006

(51) Int. Cl.
*H01P 1/22* (2006.01)
(52) U.S. Cl. .................. 333/81 R; 333/17.2; 327/308
(58) Field of Classification Search ........... 333/81 R, 333/17.2; 327/308, 309
See application file for complete search history.

(56) References Cited

U.S. PATENT DOCUMENTS

| 5,448,207 | A | * | 9/1995 | Kohama ................. 333/81 R |
| 5,926,466 | A | * | 7/1999 | Ishida et al. ............. 370/280 |
| 6,094,055 | A | * | 7/2000 | Dosdall et al. ........... 324/601 |
| 7,184,731 | B2 | * | 2/2007 | Kim ..................... 455/249.1 |

* cited by examiner

*Primary Examiner*—Stephen E. Jones

(57) ABSTRACT

An integrated step attenuator ("ISA") monolithically integrated on a single chip for adjusting an input signal. The ISA may include a step attenuation network ("SAN") that may include at least one switchable attenuation section, and at least one electronically switchable trimming network ("ESTN"). The SAN may be configured to adjust the input signal responsive to the state of a switch that bridges the attenuation sections of the SAN, and the ESTN may be configured to adjust the input signal responsive to the state of a switch in signal communication with one or more shunt resistors in the ESTN.

10 Claims, 16 Drawing Sheets

FET Switch $R_{on}$ $C_{off}$

BROADBAND STEP ATTENUATOR WITH IMPROVED TIME DOMAIN PERFORMANCE

BACKGROUND OF THE INVENTION

Fixed and step attenuators are used in a wide variety of applications for signal conditioning and level control. Specifically, attenuators may reduce signal levels, match impedances of sources and loads, and measure gain or loss of a two-port device. Step attenuators are widely used in electronic systems to control the amplitude of signals. Step attenuators, as opposed to fixed value attenuators, have attenuation values that may be selected by electronically or digitally controlled lines, and there may be one attenuation state or multiple attenuation states. They are usually made with resistors having fixed resistances that are connected by electrically controllable switches. The switches may be mechanical (e.g., microelectromechanical systems ("MEMS") switches or traditional relays) or made with semiconductors (e.g., Field Effect Transistors ("FETs")). These resistors are usually connected to form "Pi" (see FIG. 1A) or "T" attenuators (see FIG. 1B), but it appreciated by those skilled in the art that other topologies are possible.

Generally, there are a number of characteristics of step attenuators that are important for time domain signal control at high frequencies:

(a) The attenuator should be matched to the transmission or circuit characteristic impedance, often called $Z_o$, which is typically about 50 or 75 ohms;

(b) The insertion loss of the step attenuator should be as small as possible to avoid signal loss;

(c) The attenuation step size, which is the difference in dB between the maximum attenuation and minimum attenuation for each attenuation level, should be constant with frequency; and (d) The group delay should be constant over the frequency of operation to ensure time domain response fidelity.

Typically, an attenuator match in an electronic system is established by the impedance values and the resistance of the switches in the attenuator in their "ON" state. It is appreciated that while the attenuator may have a perfect match with the nominal values of the impedances and switch "on resistance," this match will change whenever these impedances vary within their manufacturing tolerances. Generally, switch devices (such as PIN diodes and FETs) are modeled simply as impedances in the "ON" state, and capacitors in the "OFF" state. As an example, an ideal switch (FIG. 1C) has zero impedance in the "ON" state and infinite impedance and zero capacitance in the "OFF" state. Generally, for a switch, there is an ON resistance "$R_{on}$" (FIG. 1C) and an OFF capacitance "$C_{off}$" (FIG. 1C) and it is appreciated that there will be a manufacturing tolerance for $R_{on}$ that will influence the attenuator match.

In an integrated circuit ("IC" or "chip"), impedances are typically realized with lightly doped semiconductor regions or traces of resistive metals. Therefore, in an IC type of switch, there is a manufacturing tolerance for the impedances and the resulting variation in the impedances values and the $R_{on}$ of the IC switch generally limits the accuracy of the attenuator match. In an example where the impedance is a resistor, the resistor accuracy in an IC may be +/−15% and the $R_{on}$ accuracy may be +/−5%.

Unlike monolithic attenuators on an IC, a known method to improve the match tolerance for attenuators made with discrete parts is to select impedances and switches with tighter tolerances. Unfortunately, this adds to the cost of the attenuator. If the attenuator is implemented monolithically in an integrated circuit, the resistors may be trimmed on chip (e.g., by heat or with a laser). As an alternative, selected or trimmed discrete resistors may be added externally to the chip. Unfortunately, both these approaches add cost and complexity to the attenuator assembly.

The attenuation step value typically varies with frequency due to electrical parasitics and the inherent limitations of the switching elements. As an example, in an attenuator with series switch elements, the capacitance across the series switches while in the "OFF" state generally causes the attenuation step to decrease with increasing frequency. This may be compensated for by adding low pass filters to the attenuator. These low pass filters are usually implemented with fixed or switchable shunt capacitors. Unfortunately, while these shunt-capacitor low pass filters are effective in extending the bandwidth over which the attenuation is constant, they usually increase the minimum attenuation and add complexity to the design and implementation of the attenuator assembly.

Therefore, there is a need to improve the accuracy and tolerance of the attenuator match in a way that is less complex and expensive than present systems, and also to individually adjust the impedance match for each attenuation state so as to improve accuracy and correct for impedance drifts over time. Additionally, there is a need to improve the accuracy of the attenuation step at higher frequencies with small degradation to the minimum attenuation, as well as improve group delay flatness at higher frequencies, which improves time domain response fidelity.

SUMMARY

An integrated step attenuator ("ISA") for adjusting an input signal is disclosed. The ISA may include a step attenuation network ("SAN"), wherein the SAN includes at least one switchable attenuation section that is configured to adjust the input signal responsive to a state of a switch that bridges the at least one switchable attenuation section and at least one electronically switchable trimming network ("ESTN"). The at least one ESTN may include at least one shunt resistor and an ESTN switch in signal communication with the at least one shunt resistor. Additionally, the at least one ESTN may be configured to adjust the input signal responsive to the state of the ESTN switch.

As an example of operation, the ISA performs a process for adjusting an input signal utilizing the ISA. The process may include receiving the input signal at an input connection to the ISA, adjusting the input signal in a step attenuation network ("SAN"), and producing an adjusted input signal at an output connection of the ISA.

Other systems, methods and features of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

DETAILED DESCRIPTION

In the following description of the preferred embodiment, reference is made to the accompanying drawings that form a part hereof, and which show, by way of illustration, specific embodiments in which the invention may be practiced. Other embodiments may be utilized and structural changes may be made without departing from the scope of the present invention.

An integrated step attenuator ("ISA") monolithically integrated on a single chip is disclosed. The ISA may include electronically switchable trimming networks ("ESTNs") operating on the input to or the output of the ISA, or both, and one or more step attenuator networks ("SANs") is disclosed. The integrated circuit process elements that are used in the implementation may include resistors, inductors and Field Effect Transistors ("FETs"), although the invention is applicable to any switchable element used in place of the FET switches, e.g., TTL or CMOS switches.

Each electronically switchable ESTN may include of a number of shunt resistors from the signal path to ground with FET switches in series with each resistor. There may be one or more switchable shunt resistors depending on the level of input and output match control desired. Any combination of shunt resistors may be connected from the signal path to ground by turning on the corresponding switches. The SANs may be either "bridge-T" or bridge-Pi" networks, and may include inductors.

If an attenuator overall match to $Z_o$ is desired, the match impedance to the internal step attenuator circuits must be designed to be higher than $Z_o$ so that shunt elements can compensate for the resistor tolerance variation. The input and output ESTNs may be independently controllable. In one embodiment, the input and output ESTNs are controlled simultaneously from a common set of control lines, and each ESTN consists of four shunt resistors in series with FET switches.

Figure 1A:
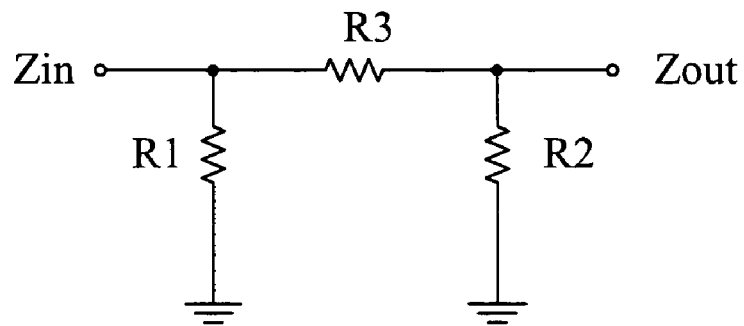
FIGS. 1A and 1B are schematic diagrams of a known "pi" attenuator and a known "T" attenuator, respectively.
Figure 1B:
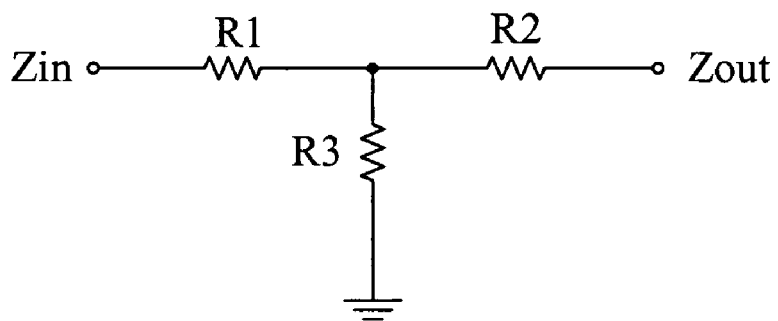
Figure 1C:
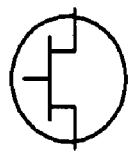
FIG. 1C is an illustration of the components of a simplified ideal switch model.
Figure 1C:
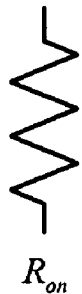
Figure 1C:
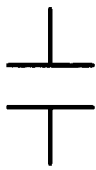
Figure 2:
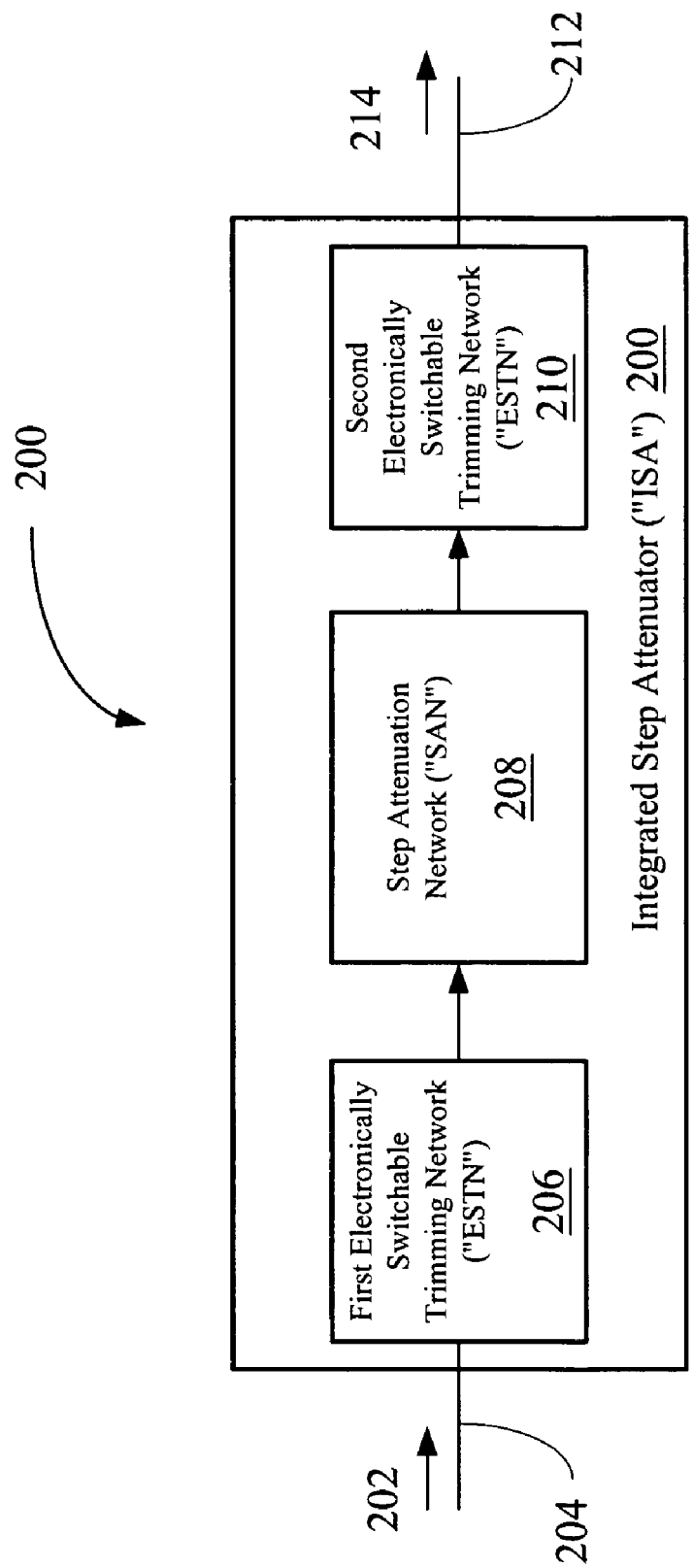
FIG. 2 is a block diagram of an example implementation of an Integrated Step Attenuator ("ISA").

In general, the ISA is a step attenuator monolithically integrated on a single integrated circuit (known as an "IC" or "chip"). In FIG. 2, a block diagram of an example implementation of an ISA 200 that receives an input signal 202 via signal path 204 is shown. The ISA 200 may include a first ESTN 206, SAN 208, and second ESTN 210. The SAN 208 may be in signal communication with both the first ESTN 206 and second ESTN 210.

In an example of operation, the input signal 202 is passed to the first ESTN 206, and then to the SAN 208. The output signal from SAN 208 is then passed to the second ESTN 210. The ESTN 210 then produces an output signal 214 via signal path 212.

Figure 3:
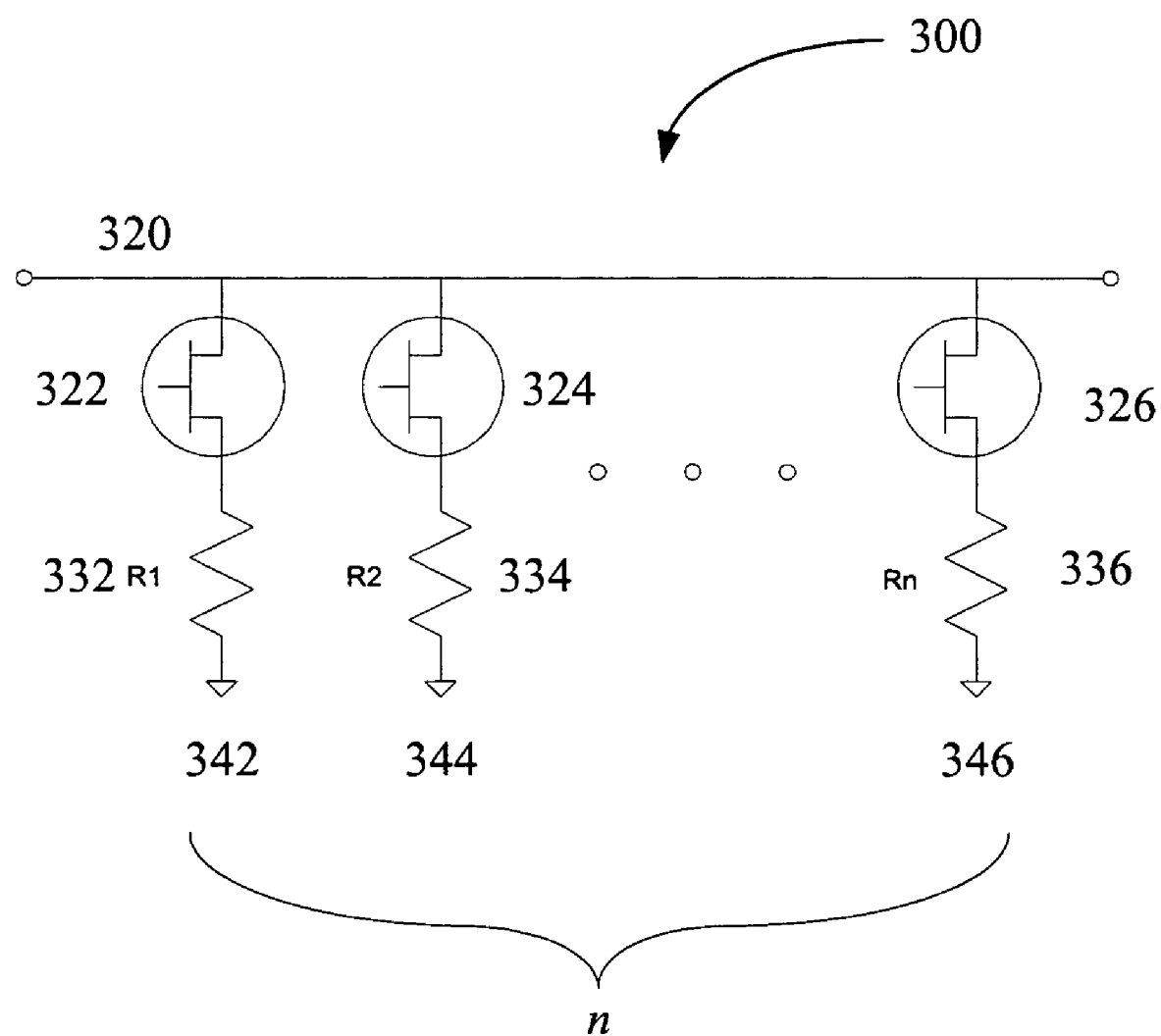
FIG. 3 is a schematic circuit diagram of an example implementation of an electronically switchable trimming network ("ESTN") of the ISA shown in FIG. 2.
Figure 4:
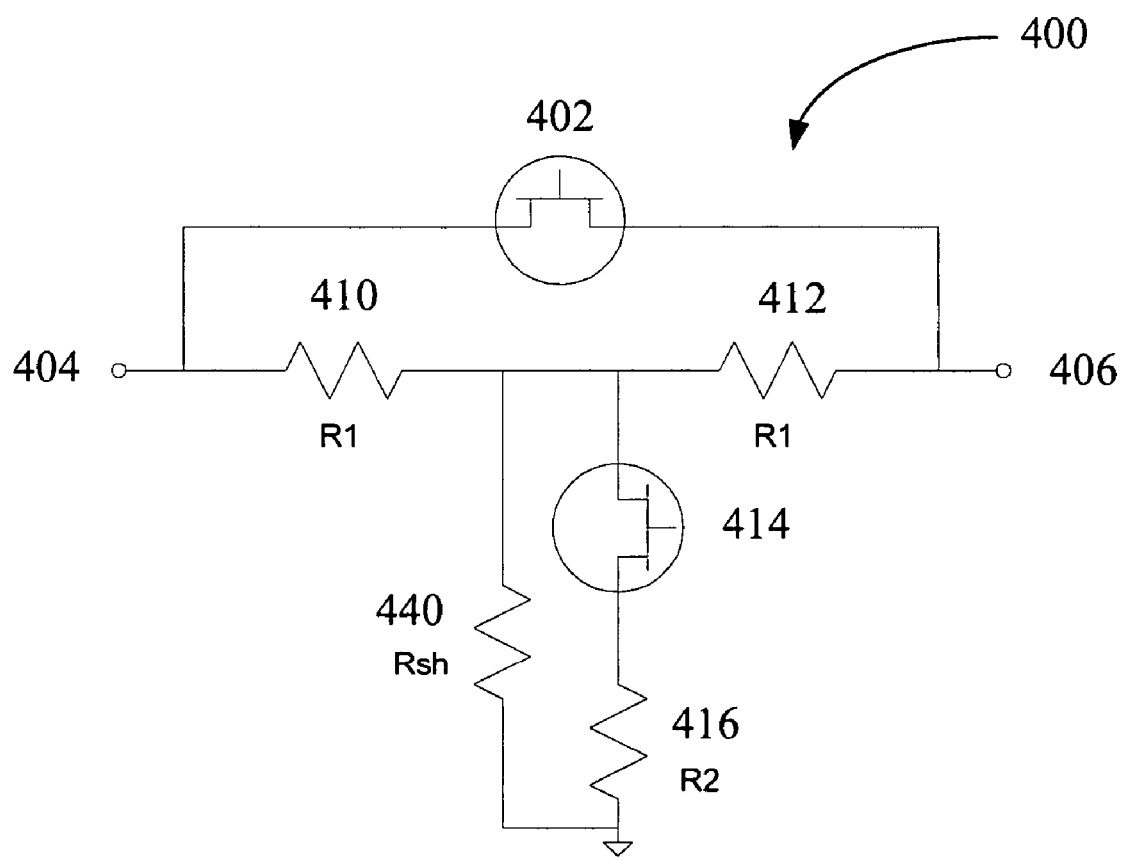
FIG. 4 is a schematic circuit diagram of an example implementation of the step attenuator network ("SAN") shown in FIG. 2 utilizing a single "bridge-T" implementation.
Figure 5:
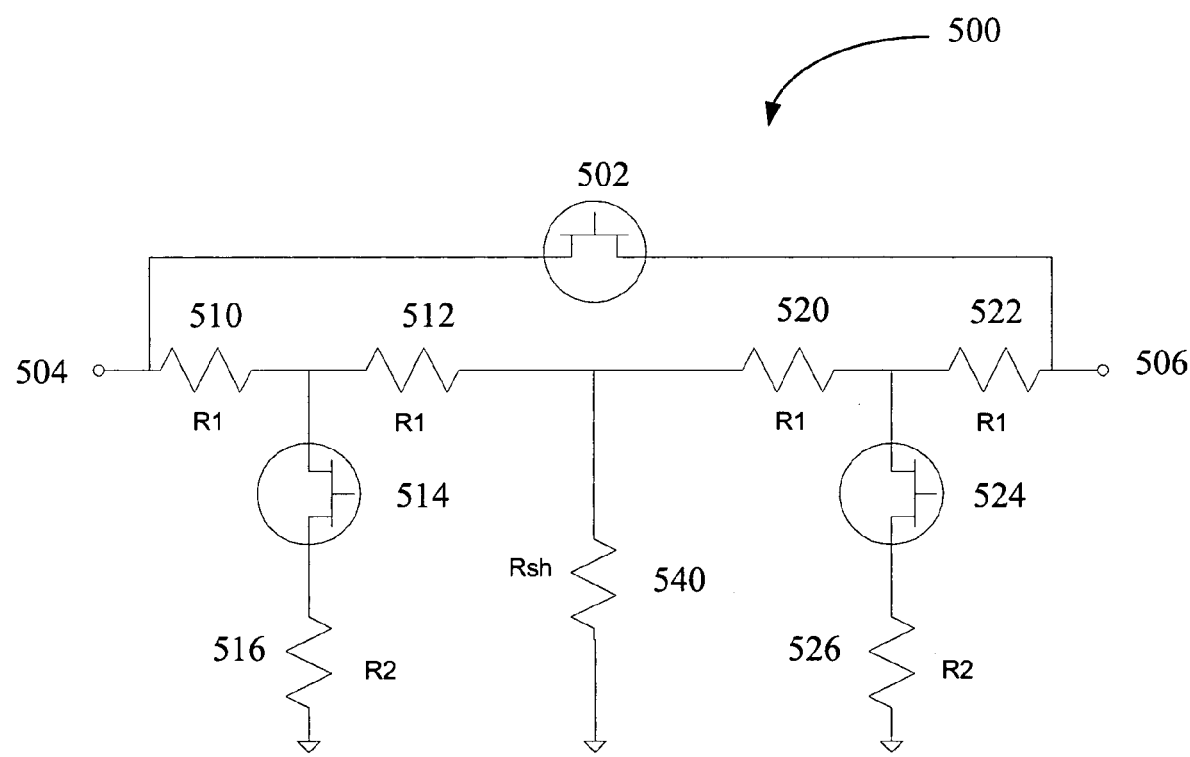
FIG. 5 is a schematic circuit diagram of another example implementation of the SAN shown in FIG. 2 utilizing a double "bridge-T" implementation.
Figure 6:
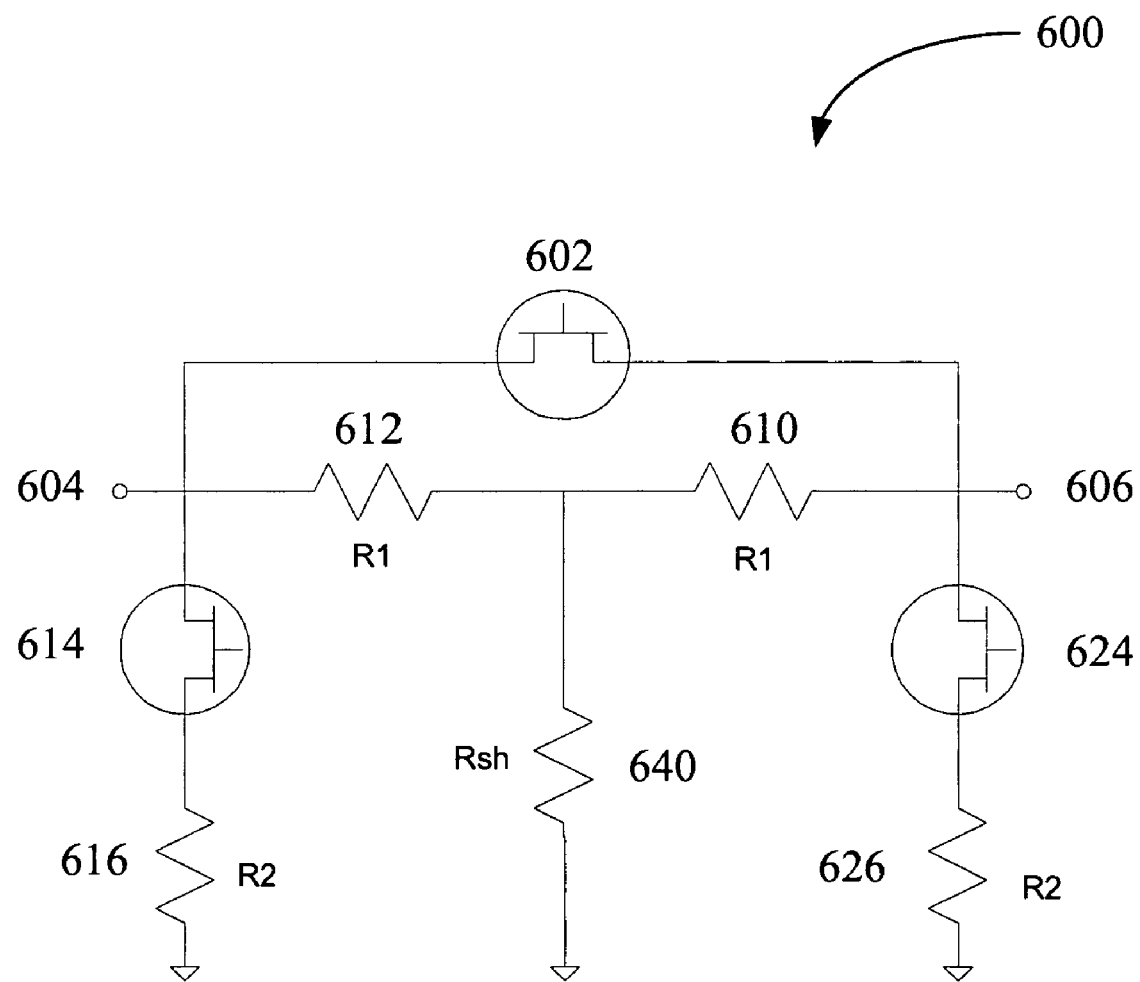
FIG. 6 is a schematic circuit diagram of another example implementation of the SAN shown in FIG. 2 utilizing a single "bridge-Pi" implementation.
Figure 7:
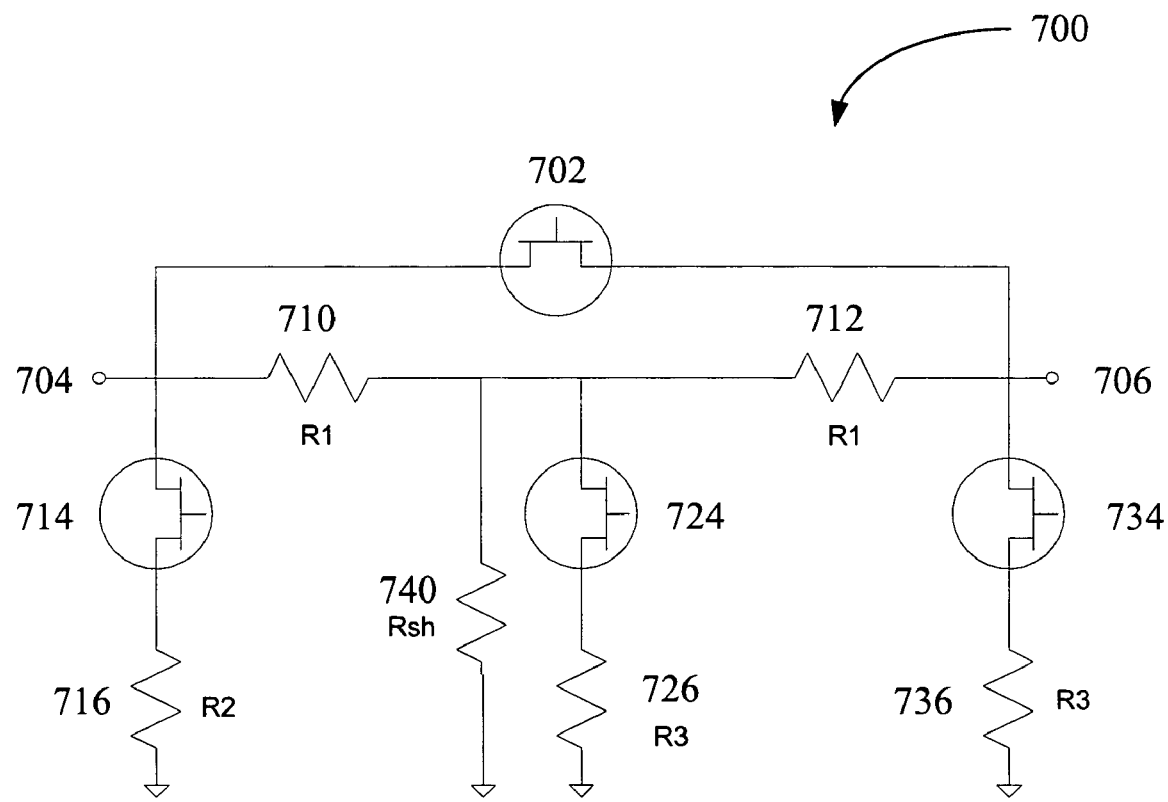
FIG. 7 is a schematic circuit diagram of another example implementation of the SAN shown in FIG. 2 utilizing a double "bridge-Pi" implementation.
Figure 8:
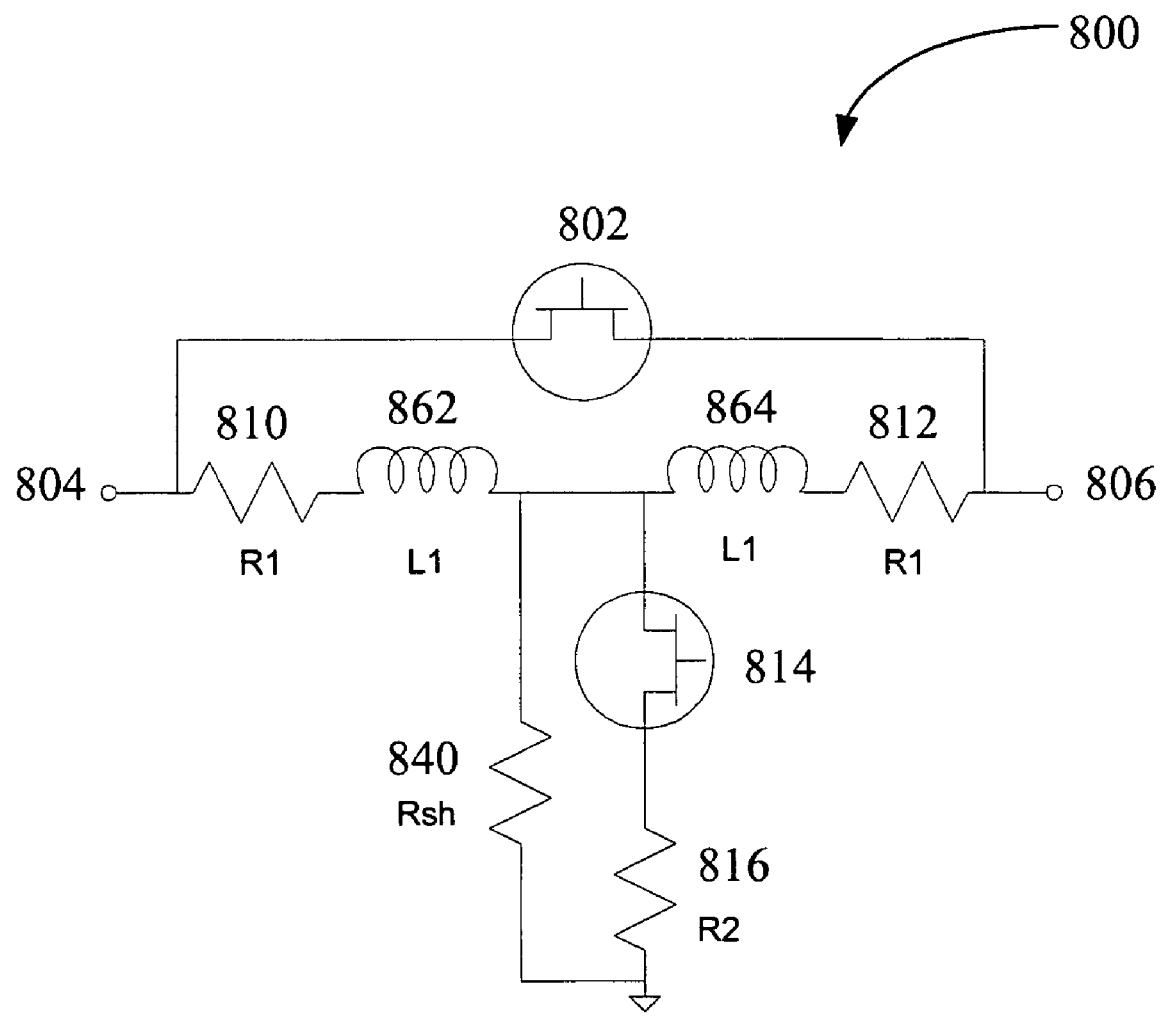
FIG. 8 is a schematic circuit diagram of another example implementation of the SAN shown in FIG. 2 utilizing another single "bridge-T" implementation.
Figure 9:
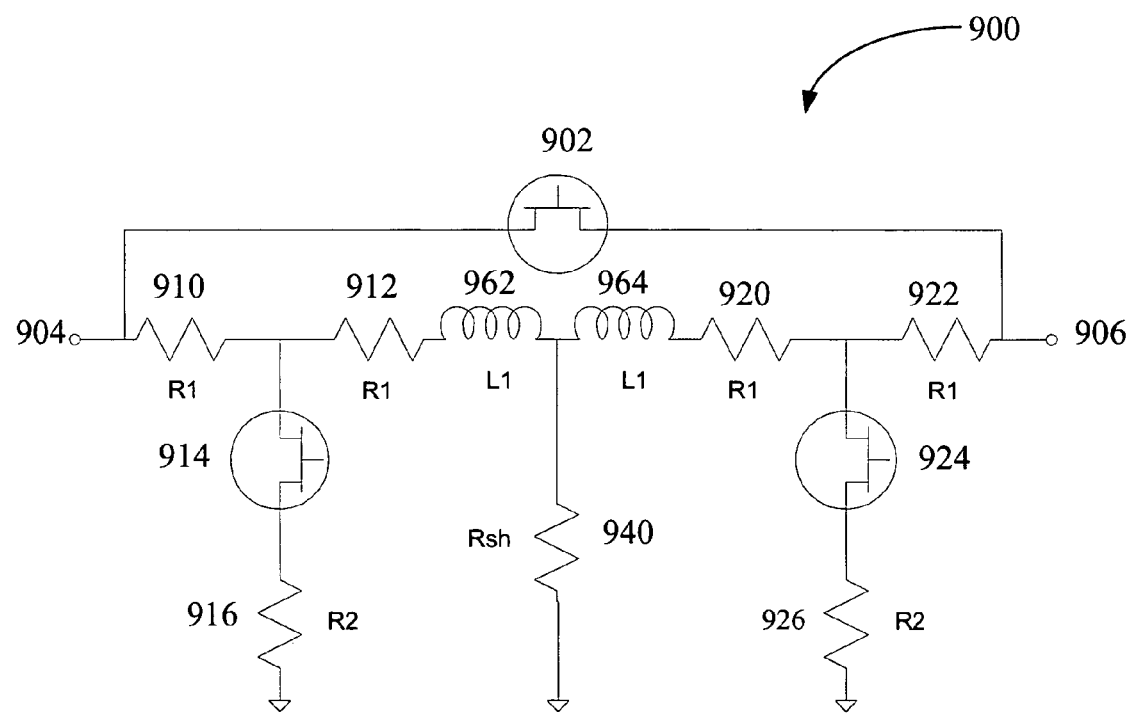
FIG. 9 is a schematic circuit diagram of another example implementation of the SAN shown in FIG. 2 utilizing another double "bridge-T" implementation.
Figure 10:
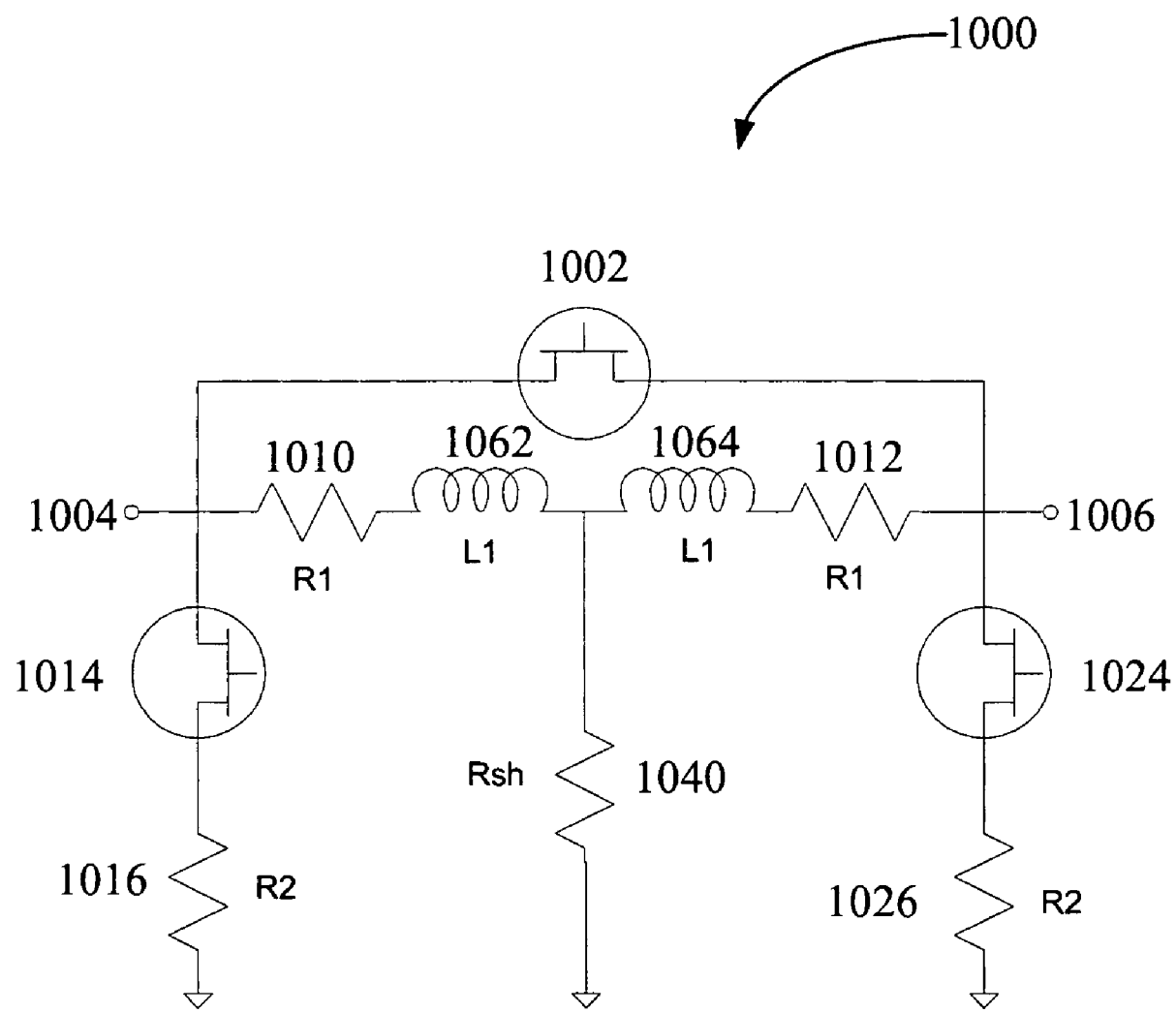
FIG. 10 is a schematic circuit diagram of another example implementation of the SAN shown in FIG. 2 utilizing another single "bridge-Pi" implementation.
Figure 11:
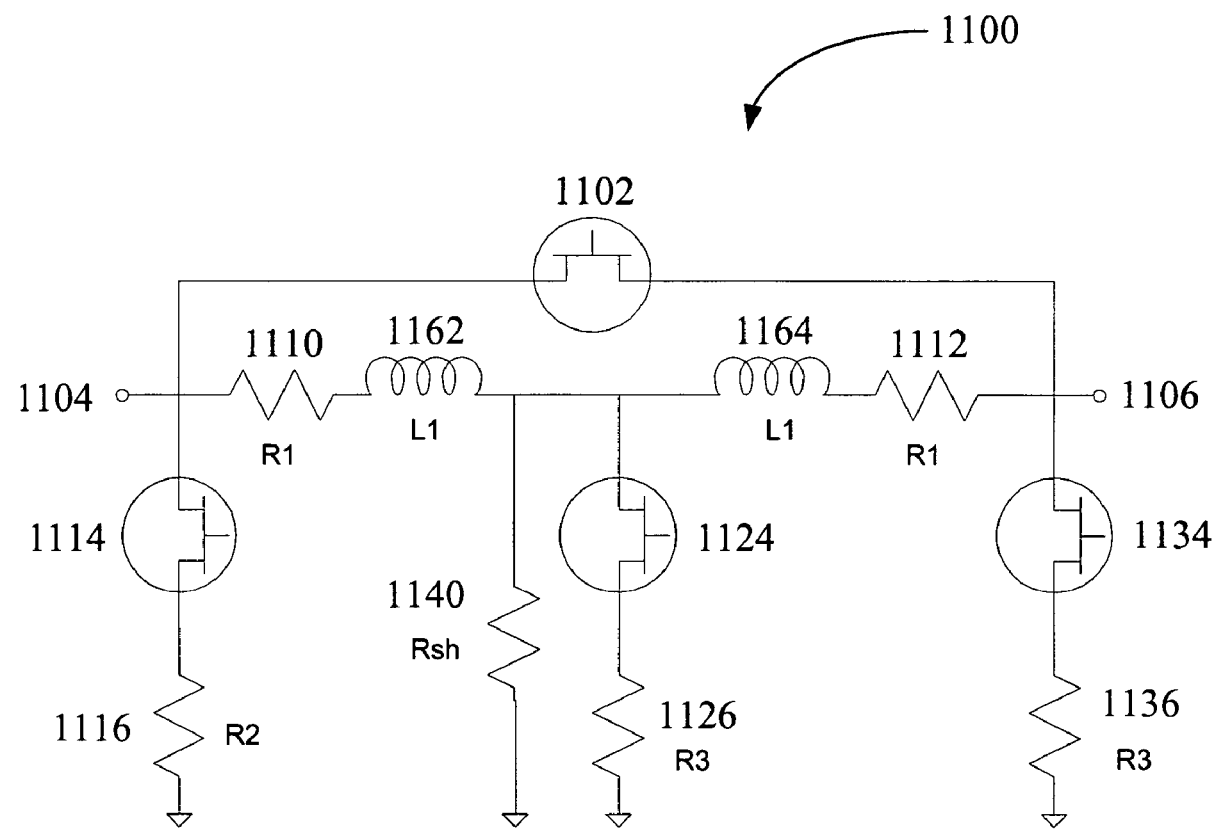
FIG. 11 is a schematic circuit diagram of another example implementation of the SAN shown in FIG. 2 utilizing another double "bridge-Pi" implementation.

In FIG. 3, a block diagram of an example of an implementation of an ESTN of FIG. 2 is shown. Generally, each ESTN may include one or more shunt impedances (such as, for example, resistors) from the signal path to ground, with FET switches in series with each impedance depending on the level of input and output match control desired. In this example of an implementation, the ESTN may include "n" resistors 332, 334, 336, each with a controllable FET switch 322, 324, 326 in series (for simplicity, all FET switches are shown in the drawings with the control line disconnected).

It is appreciated by those skilled in the art that any combination of the shunt resistors may be in signal communication from the signal path 320 to ground 342, 344, and 346 by turning on the corresponding switches 322, 324, and 326. If an attenuator overall match to $Z_o$ is desired, the match impedance to the SAN 208, FIG. 2, should be designed to be higher than $Z_o$ so that the shunt elements may compensate for the resistor tolerance variation. Additionally, the first ESTN 206 and the second ESTN 210 may each be controlled independently or from a common set of control lines (not shown).

As an example of implementation, the SAN 208, FIG. 2, may include "bridge-T" or "bridge-Pi" networks that are realized with one or more "T" or "Pi" sections cascaded in series with a FET switch that bridges the sections from input to output. As an example, in FIGS. 4, 5, 6, and 7, schematic circuit diagrams of examples of implementations, respectively, of a single "bridge-T" SAN implementation 400, a double "bridge-T" SAN implementation 500, a single "bridge-Pi" SAN implementation 600, and a double "bridge-Pi" SAN implementation 700 of the SAN 208 of FIG. 2 are shown. A FET switch 402, 502, 602, 702 bridges each section from input to output in the SAN 400, 500, 600, and 700, respectively. An additional shunt resistor "$R_{sh}$" 440, 540, 640, 740 may be included in these circuits to compensate for the $R_{on}$ of the series switches 402, 502, 602 and 702 and to establish a good match when the SANs 400, 500, 600 and 700, respectively, are in their minimum attenuation state.

While the "bridge-T" and "bridge-Pi" SANs 400, 500, 600, and 700, respectively, may have broadband performance, at high frequencies the $C_{off}$ of the bridging FET switch acts to decrease the attenuation step size. The accuracy of the attenuation step at higher frequencies and the group delay flatness may be improved by adding inductors as shown in FIGS. 8, 9, 10, and 11. Accordingly, in FIGS. 8, 9, 10, and 11, schematic circuit diagrams of examples of other implementations, respectively, of a single "bridge-T" SAN implementation 800, a double "bridge-T" SAN implementation 900, a single "bridge-Pi" SAN implementation 1000, and a double "bridge-Pi" SAN implementation 1100 of the SAN 208 of FIG. 2 are shown. The implementation examples of FIGS. 8, 9, 10, and 11 are similar to those of FIGS. 4, 5, 6, and 7, with the addition of inductors 862, 864, 962, 964, 1062, 1064, 1162, and 1164, respectively.

In the high attenuation state, the simple model of each of the series FETs 402, 502, 602, 702, 802, 902, 1002 and 1102 respectively, in FIGS. 4, 5, 6, 7, 8, 9, 10, and 11, is a capacitor with capacitance $C_{off}$. The inductors 862, 864, 962, 964, 1062, 1064, 1162, and 1164, respectively, along with the $C_{off}$ of the series FET switches 802, 902, 1002 and 1102, respectively, and the series resistor elements 810, 812, 910, 912, 920, 922, 1010, 1012, 1110 and 1112, respectively, of the "T" or "Pi" sections, form individual damped parallel-resonant circuits that extends the frequency response of the networks. As such, the susceptance of $C_{off}$ of the FET switches may be completely or partially cancelled by the inductors, which prevents the attenuation step response from decreasing as rapidly as the frequency is increased.

Figure 12:
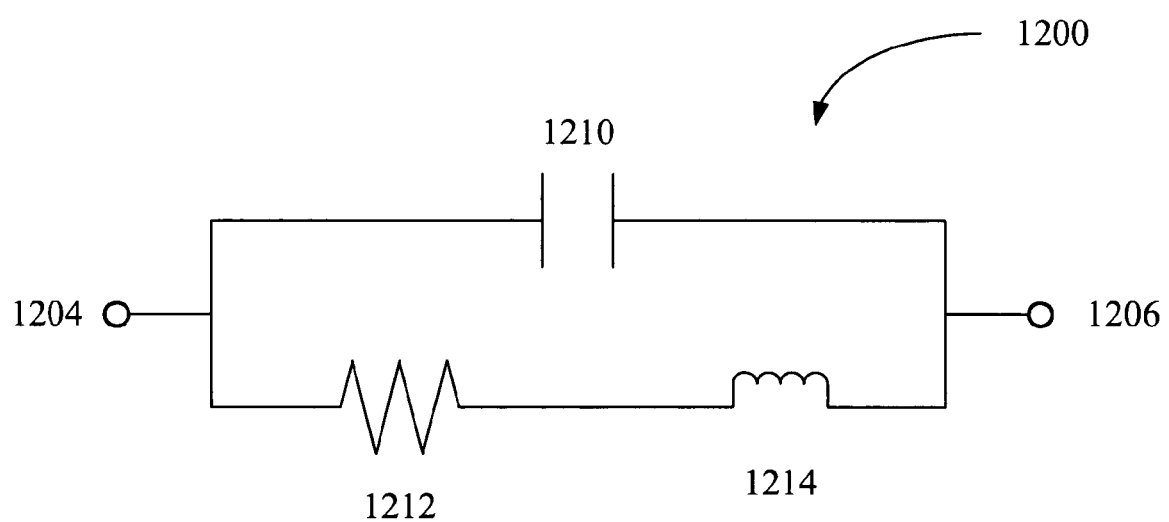
FIG. 12 is a schematic circuit diagram of an example of an implementation of a simplified circuit demonstrating the compensation effect of the inductors in the SAN shown in FIGS. 8, 9, 10, and 11.

To illustrate the effect of the individual inductors 862, 864, 962, 964, 1062, 1064, 1162, and 1164, respectively, a schematic circuit diagram of an example of an implementation of a simplified circuit 1200 demonstrating the compensation effect of the inductors in the different implementations of SAN, of FIG. 2, is shown in FIG. 12. The simplified circuit 1200 may include a capacitor 1210 shunted by the series connection of a resistor 1212 and an inductor 1214. The capacitor 1210 corresponds to $C_{off}$ of the individual FET switches 802, 902, 1002 and 1102, respectively, and the resistor 1212 corresponds to the series resistors 810, 812, 910, 912, 920, 922, 1010, 1012, 1110 and 1112, respectively, in the "Pi" or "T" sections of the different implementations of SAN shown in FIGS. 8, 9, 10, and 11. Similarly, the inductor 1214 corresponds to the compensation inductor 862, 864, 962, 964, 1062, 1064, 1162, and 1164, respectively of the different implementations of SAN shown in FIGS. 8, 9, 10, and 11. In general, the impedance of the circuit 1200 is described as follows:

$$Z = \frac{R}{(1-\omega^2 LC)^2 + (\omega RC)^2} + j\frac{(\omega L - \omega^3 L^2 C - \omega R^2 C)}{(1-\omega^2 LC)^2 + (\omega RC)^2} \quad (1)$$

The capacitive susceptance may be cancelled at low frequencies by selecting the value of inductance determined as follows:

$$L = R^2 C \quad (2)$$

The impedance of the network in FIG. 12 with the compensating inductor as described in relationship (2) is described by:

$$Z = \frac{R}{1-\omega^2 R^2 C^2} - j\frac{\omega^3 R^4 C^3}{1-\omega^2 R^2 C^2} \quad (3)$$

Relationship (3) reduces to the following relationship (4) when $2\pi fC$ is small compared to 1/R (it is appreciated that under these conditions the imaginary part of the impedance has been cancelled):

$$Z \approx R(1+\omega^2 R^2 C^2) \quad (4)$$

The inductance L given by relationship (2) may be utilized as a starting point for selecting a compensation inductor for a given implementation of the SAN. The value of compensating inductance that optimizes performance may be selected by simulating the entire attenuation section.

Figure 13:
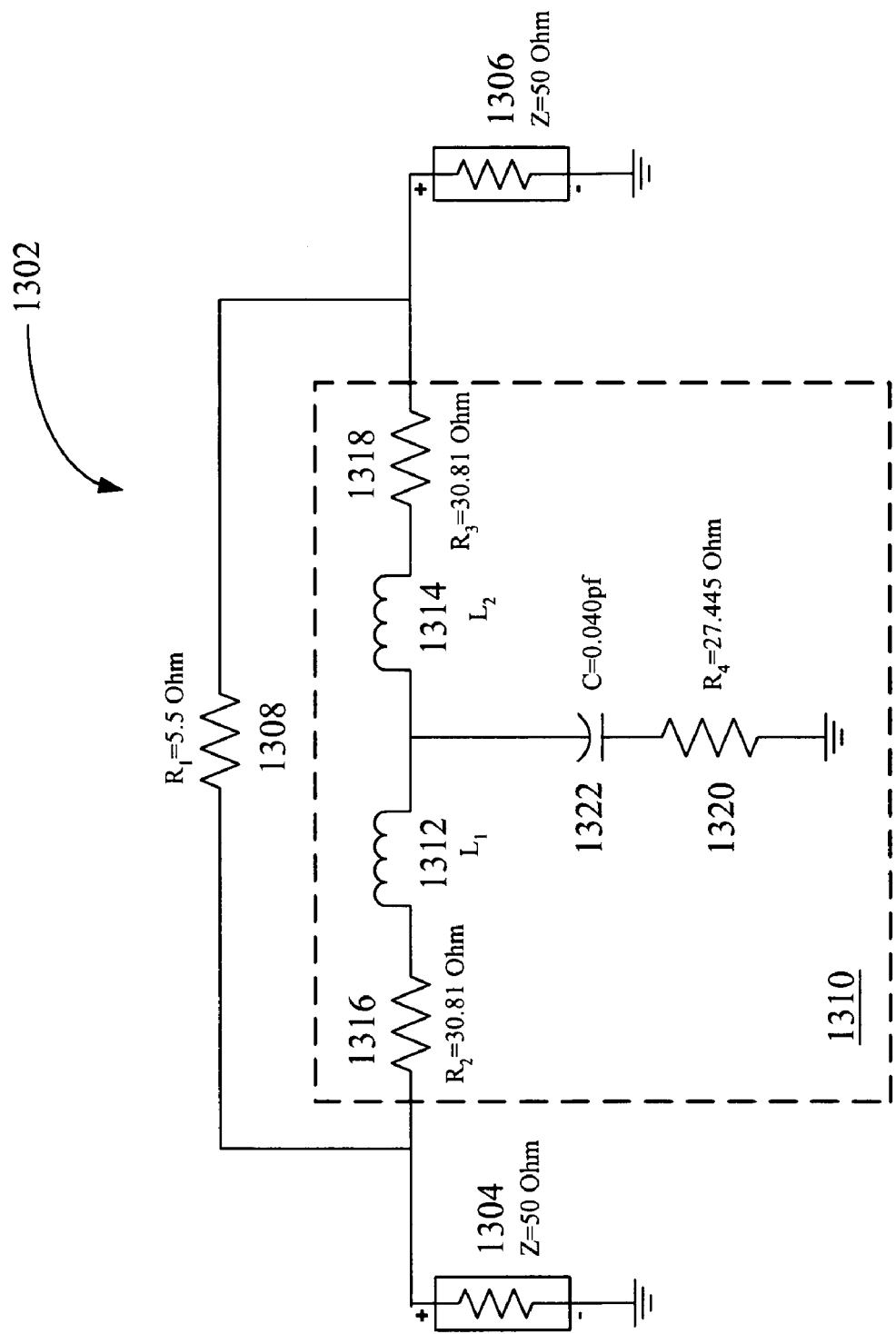
FIG. 13 is a schematic circuit diagram of an example of an implementation of the ISA of FIG. 8 as a 10 dB ISA in a minimum insertion loss state.
Figure 14:
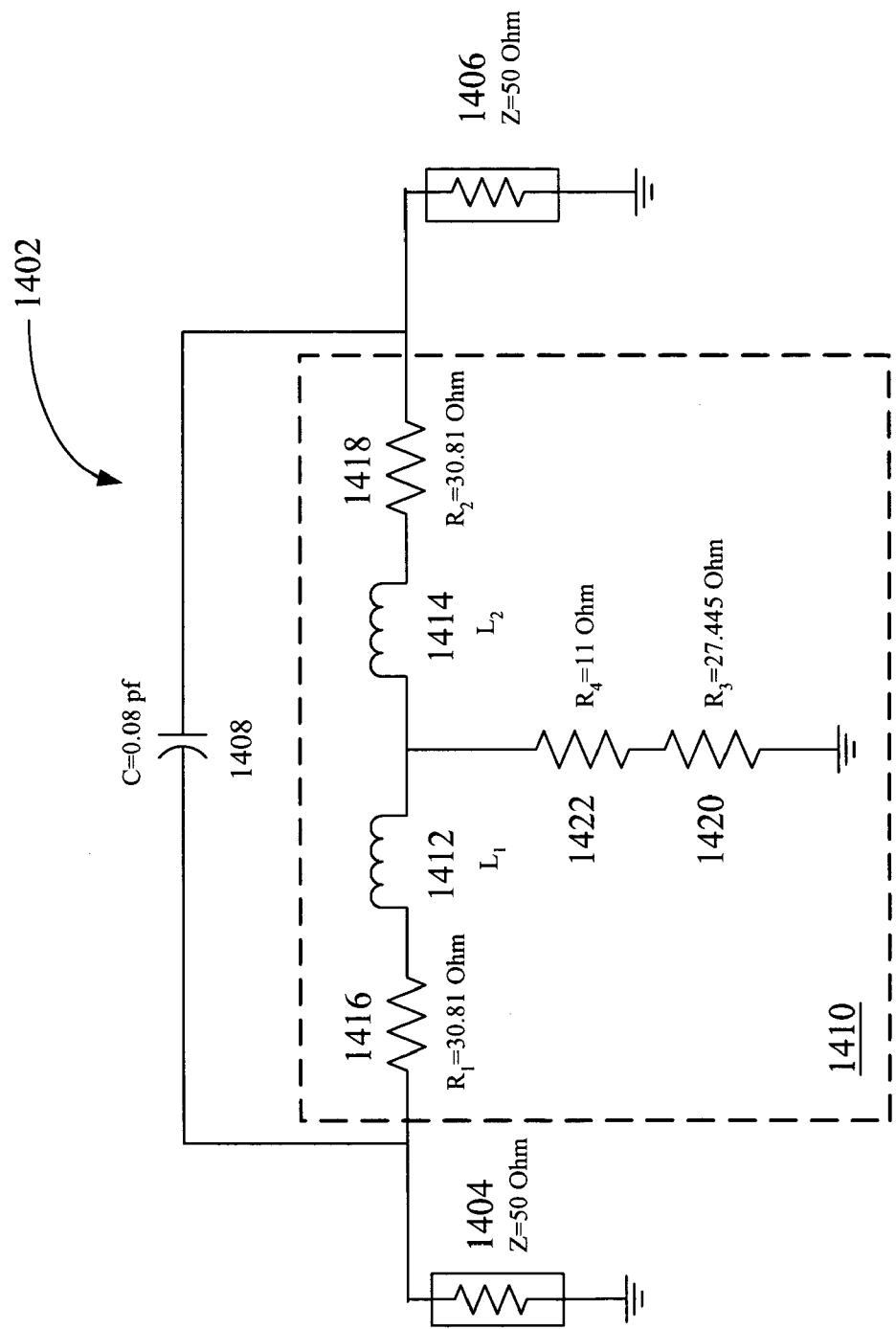
FIG. 14 is a schematic circuit diagram of an example of an implementation of the ISA of FIG. 8 as a 10 dB ISA in a maximum insertion loss state.

Utilizing these relationships, examples of implementations of the ISA of FIG. 2 are shown in both FIGS. 13 and 14. In FIG. 13, a schematic circuit diagram of an example of an implementation of the ISA 1302 as a 10 dB ISA in a minimum insertion loss state is shown. Similarly, in FIG. 14, a schematic circuit diagram of an example of another implementation of the ISA 1402 as a 10 dB ISA in a maximum insertion loss state is shown.

As an example, in FIG. 13, the ISA 1302 may be in signal communication with an input terminal device 1304 and output terminal device 1306 both having an impedance of 50 ohms. In this example, the series FET switch 1308 that bridges the single "bridge-T" attenuator section 1310 with inductors $L_1$ 1312 and $L_2$ 1314 is set to ON (i.e., acts like a small resistance $R_1$ having an example resistance value of about 5.5 Ohms) and the attenuator section 1310 is in a minimum attenuation state. Additionally, in this example, the inductors $L_1$ 1312 and $L_2$ 1314 may be set to either zero, for no compensation, or 0.07 nH for high frequency compensation. The resistances $R_2$ 1316 and $R_3$ 1318 may both be set to about 30.81 Ohms, and the resistance $R_4$ 1320 may be set to about 27.445 Ohms. Additionally, FET switch 1322 in the attenuator section 1310 is set to OFF and acts like a capacitor C having a capacitance of about 0.040 pf.

As another example, in FIG. 14, the ISA 1402 may be in signal communication with an input terminal device 1404 and output terminal device 1406 both having an impedance of 50 ohms. In this example, the series FET switch 1408 that bridges the single "bridge-T" attenuator section 1410 with inductors $L_1$ 1412 and $L_2$ 1414 is set to OFF (i.e., acts like a small capacitance C having an example capacitance value of about 0.08 pf) and the attenuator section 1410 is in a maximum attenuation state. Similarly, in this example, the inductors $L_1$ 1412 and $L_2$ 1414 may be set to either zero, for no compensation, or 0.07 nH for high frequency compensation, the resistances $R_1$ 1416 and $R_2$ 1418 may both be set to about 30.81 Ohms, and the resistance $R_3$ 1420 may be set to about 27.445 Ohms. Additionally, the FET switch 1422 in the attenuator section 1310 is set to ON and acts like a resistor $R_4$ having a resistance value of about 11 Ohms.

Figure 15A:
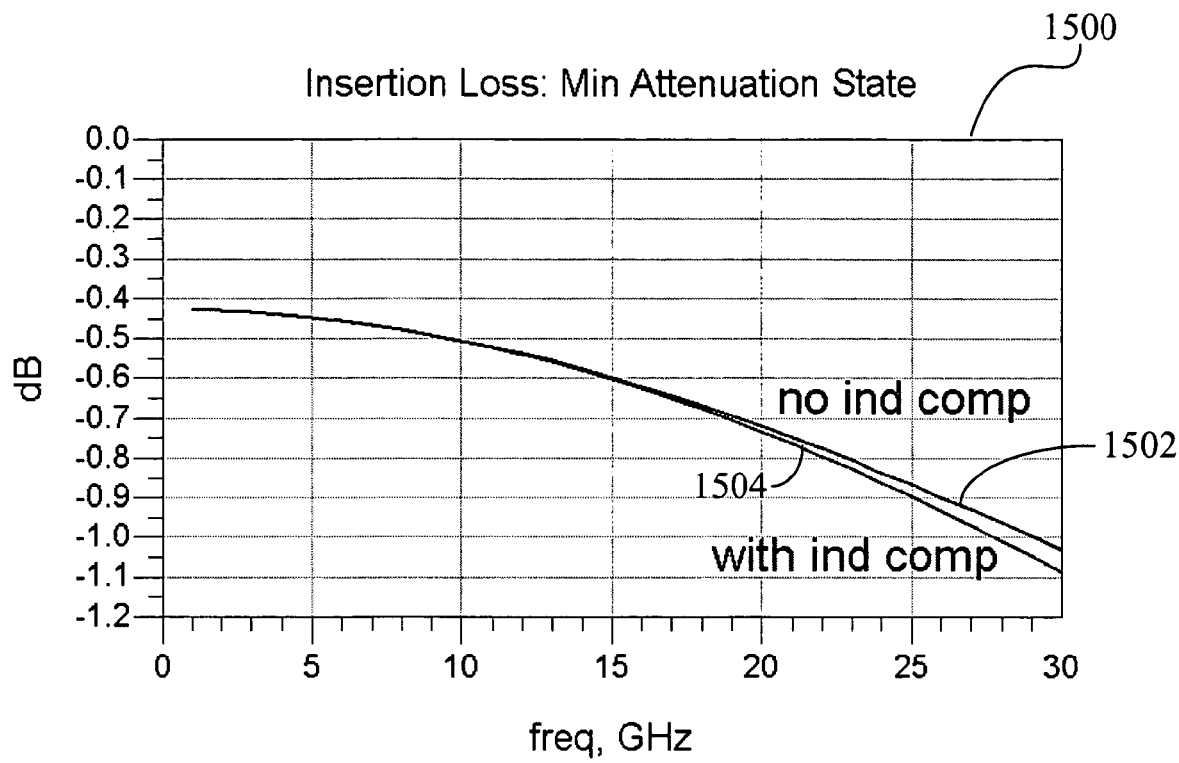
FIG. 15A is a graphical representation of an example plot of insertion loss measured in dB versus frequency in GHz for the ISA shown in FIG. 13 with and without individual high frequency compensation inductors.

As an example of operation, in FIG. 15A, a graphical representation of a plot 1500 of insertion loss measured in dBs versus frequency in GHz for the ISA of FIG. 13 (a 10 dB ISA in a minimum insertion loss state) with individual high frequency compensation 1504 (i.e., inductors 1312 and 1314 set to 0.07 nH) and without individual high frequency compensation 1502 (i.e., inductors 1312 and 1314 set to zero) is shown. FIG. 15A shows that the insertion loss from the additional compensation is negligible at higher frequencies.

Figure 15B:
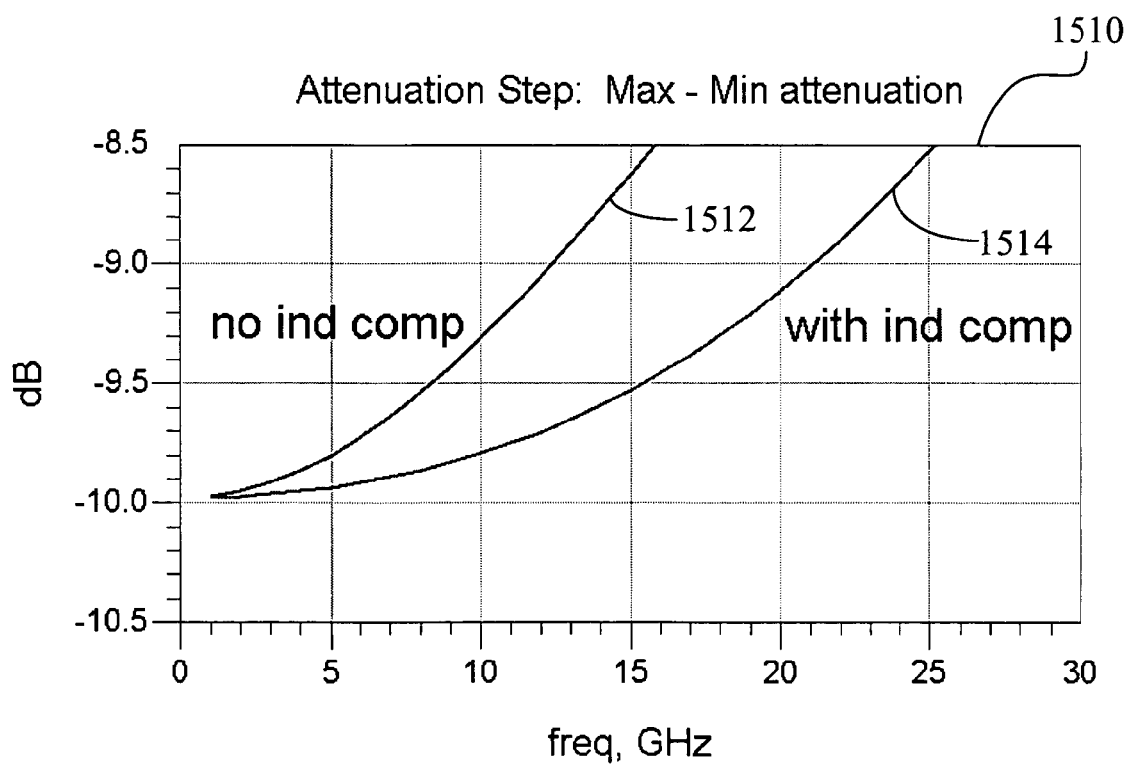
FIG. 15B is a graphical representation of another example plot of attenuation step measured in dB versus frequency in GHz for the ISA shown in FIGS. 13 and 14 with and without individual high frequency compensation inductors.

In FIG. 15B, a graphical representation of a plot 1510 of attenuation step (i.e., "maximum insertion loss" minus "minimum insertion loss") measured in dBs versus frequency in GHz for the ISA of FIGS. 13 and 14 with individual high frequency compensation 1514 (i.e., inductors 1312, 1314, 1412 and 1414 set to 0.07 nH) and without individual high frequency compensation 1512 (i.e., inductors 1312, 1314, 1412 and 1414 set to zero) is shown. FIG. 15B shows that adding the compensating inductors approximately doubled the bandwidth based on attenuator step response.

Figure 15C:
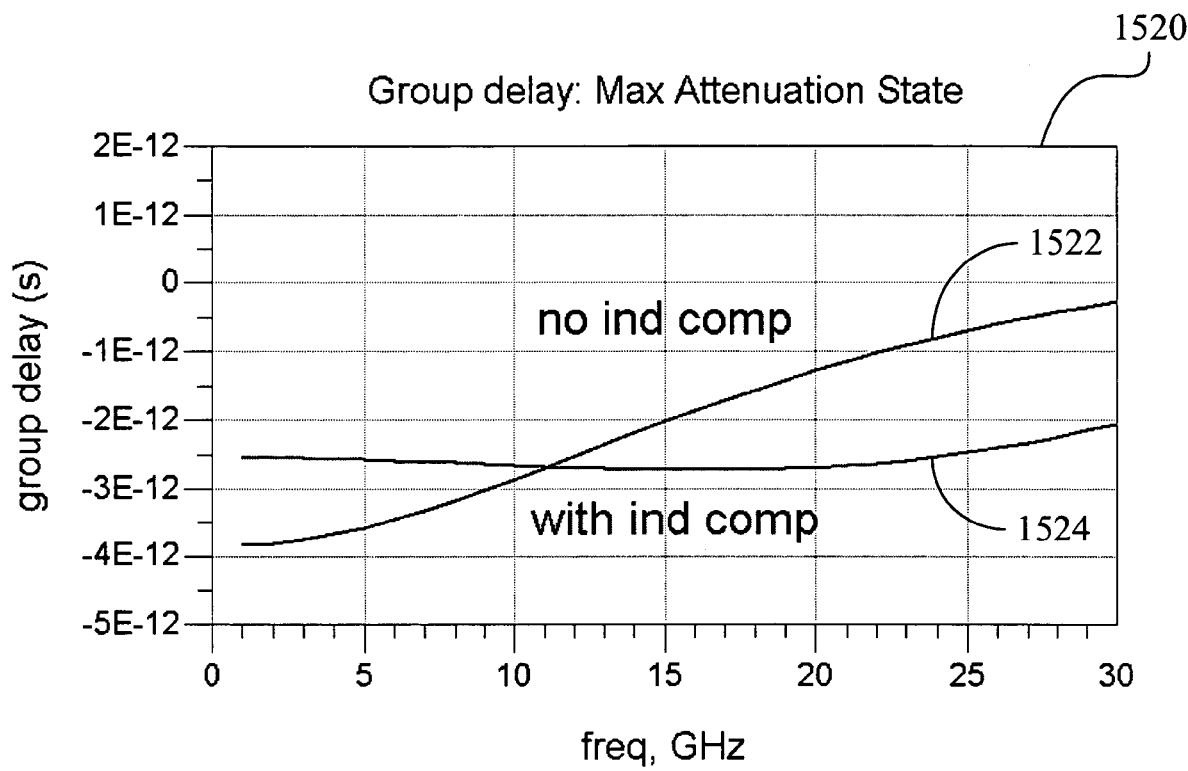
FIG. 15C is a graphical representation of the group delay in seconds versus frequency in GHz for an ISA shown in FIG. 14 with and without individual high frequency compensation inductors.

In FIG. 15C, a graphical representation of a plot 1520 of group delays measured in seconds versus frequency in GHz for the ISA of FIG. 14 (a 10 dB ISA in a maximum insertion loss state) with individual high frequency compensation 1524 (i.e., inductors 1312 and 1314 set to 0.07 nH) and without individual high frequency compensation 1522 (i.e., inductors 1312 and 1314 set to zero) is shown. FIG. 15C shows that adding the compensating inductors improves the group delay flatness.

While the foregoing description refers to the use of an ISA, the subject matter of this disclosure is not limited to such a system. Any attenuation system that could benefit from the functionality provided by the components described above may be implemented in the ISA.

Moreover, it will be understood that the foregoing description of numerous implementations has been presented for purposes of illustration and description. It is not exhaustive and does not limit the claimed inventions to the precise forms disclosed. Modifications and variations are possible in light of the above description or may be acquired from practicing the invention. The claims and their equivalents define the scope of the invention.

What is claimed is:

1. An integrated step attenuator ("ISA") for adjusting an input signal, the ISA comprising:
    a step attenuation network ("SAN"), wherein the SAN includes at least one switchable attenuation section that is configured to adjust the input signal responsive to a state of a switch that bridges the at least one switchable attenuation section; and
    at least one electronically switchable trimming network ("ESTN"), wherein the ESTN includes
        at least one shunt resistor and
        an ESTN switch in signal communication with the at least one shunt resistor,
    wherein the at least one ESTN is configured to adjust the input signal responsive to the state of the ESTN switch, wherein said ISA is characterized by an input impedance $Z_0$, said SAN has an input impedance greater than $Z_0$, and said ESTN has an input impedance that alterable by said ESTN switch, said ESTN switch being set such that $Z_0$ approximates a predetermined value that is less than said input impedance of said SAN.

2. The ISA of claim 1, wherein the ESTN switch is a FET.

3. The ISA of claim 1, wherein the at least one switchable attenuation section includes one or more circuits chosen from a group consisting of
    a single bridge-T circuit,
    double bridge-T circuit,
    single bridge-Pi circuit, and
    double bridge-Pi circuit,
    wherein the one or more circuits are cascaded in series, and
    wherein each circuit further includes the switch that bridges the circuit.

4. The ISA of claim 3, wherein the switch is a FET.

5. The ISA of claim 3, wherein said at least one ESTN adjusts an adjusted output signal received from the SAN.

6. The ISA of claim 3, wherein the input signal is an input signal received at an input connection of the ISA.

7. An integrated step attenuator ("ISA") for adjusting an input signal, the ISA comprising:
    a step attenuation network ("SAN"), wherein the SAN includes at least one switchable attenuation section that is configured to adjust the input signal responsive to a state of a switch that bridges the at least one switchable attenuation section; and
    at least one electronically switchable trimming network ("ESTN"), wherein the ESTN includes
        at least one shunt resistor and
        an ESTN switch in signal communication with the at least one shunt resistor,
    wherein the at least one ESTN is configured to adjust the input signal responsive to the state of the ESTN switch
    wherein the at least one switchable attenuation section includes one or more circuits chosen from a group consisting of
        a single bridge-T circuit,
        double bridge-T circuit,
        single bridge-Pi circuit, and
        double bridge-Pi circuit,
    wherein the one or more circuits are cascaded in series, and
    wherein each circuit further includes the switch that bridges the circuit
    wherein the at least one switchable attenuation section includes inductors configured to cancel the susceptance of the switch.

8. The ISA of claim 7, wherein the input signal is an adjusted output signal received from the SAN.

9. The ISA of claim 7, wherein the input signal adjusted is an input signal received at an input connection of the ISA.

10. An integrated step attenuator ("ISA") for adjusting an input signal, the ISA comprising:
    a step attenuation network ("SAN"), wherein the SAN includes at least one switchable attenuation section that is configured to adjust the input signal responsive to a state of a switch that bridges the at least one switchable attenuation section; and
    at least one electronically switchable trimming network ("ESTN"), wherein the ESTN includes
        at least one shunt resistor and
        an ESTN switch in signal communication with the at least one shunt resistor,
    wherein the at least one ESTN is configured to adjust the input signal responsive to the state of the ESTN switch, wherein the at least one switchable attenuation section includes one or more circuits chosen from a group consisting of
a single bridge-T circuit,
double bridge-T circuit,
single bridge-Pi circuit, and
double bridge-Pi circuit,
wherein the one or more circuits are cascaded in series, and
wherein each circuit further includes the switch that bridges the circuit, and wherein the input signal is an input signal received at an input connection of the ISA, said ISA further including a second ESTN, wherein the second ESTN adjusts a received signal from the SAN.

* * * * *

UNITED STATES PATENT AND TRADEMARK OFFICE
CERTIFICATE OF CORRECTION

| | | |
|---|---|---|
| PATENT NO. | : 7,352,259 B2 | |
| APPLICATION NO. | : 11/151854 | |
| DATED | : April 1, 2008 | |
| INVENTOR(S) | : Ehlers et al. | |

It is certified that error appears in the above-identified patent and that said Letters Patent is hereby corrected as shown below:

In column 8, line 34, in Claim 7, after "switch" insert -- , --.

In column 8, line 45, in Claim 7, after "circuit" insert -- , --.

Signed and Sealed this

Twelfth Day of August, 2008

JON W. DUDAS
*Director of the United States Patent and Trademark Office*